United States Patent
Torre et al.

(10) Patent No.: US 10,250,200 B2
(45) Date of Patent: Apr. 2, 2019

(54) LOW POWER SPECTRALLY PURE OFFSET LOCAL OSCILLATOR SYSTEM

(71) Applicant: Avago Technologies International Sales Pte. Limited., Singapore (SG)

(72) Inventors: Valentina Della Torre, Irvine, CA (US); Seema B. Anand, Rancho Palos Verdes, CA (US); Howard Chi, Palo Alto, CA (US); Matteo Conta, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/696,898

(22) Filed: Sep. 6, 2017

(65) Prior Publication Data

US 2018/0076837 A1   Mar. 15, 2018

Related U.S. Application Data (60) Provisional application No. 62/393,384, filed on Sep. 12, 2016.

(51) Int. Cl.

| | |
|---|---|
| H04B 1/06 | (2006.01) |
| H03F 1/26 | (2006.01) |
| H03F 1/56 | (2006.01) |
| H03F 3/19 | (2006.01) |
| H03F 3/24 | (2006.01) |
| H04B 1/10 | (2006.01) |

(Continued)

(52) U.S. Cl.
CPC ............... *H03F 1/26* (2013.01); *H03F 1/223* (2013.01); *H03F 1/56* (2013.01); *H03F 3/19* (2013.01); *H03F 3/245* (2013.01); *H03F 3/265* (2013.01); *H04B 1/04* (2013.01); *H04B 1/10* (2013.01); *H04B 1/40* (2013.01); *H04L 27/0002* (2013.01); *H03F 2200/294* (2013.01); *H03F 2200/333* (2013.01); *H03F 2200/387* (2013.01); *H03F 2200/451* (2013.01); *H03K 21/08* (2013.01); *H04B 2001/0491* (2013.01)

(58) Field of Classification Search
None
See application file for complete search history.

(56) References Cited

U.S. PATENT DOCUMENTS

| | | | | |
|---|---|---|---|---|
| 5,535,247 A | * | 7/1996 | Gailus .................... | H03C 3/08 330/107 |
| 6,708,026 B1 | * | 3/2004 | Klemmer ............... | H03D 7/163 331/16 |

(Continued)

*Primary Examiner* — Tuan A Tran
(74) *Attorney, Agent, or Firm* — Sterne, Kessler, Goldstein & Fox P.L.L.C.

(57) ABSTRACT

The present disclosure is directed to a dual output path LNA that can be used to break the tradeoff between the output impedance and linearity of an LNA without the problems of a programmable output impedance LNA. In an embodiment, the dual output path architecture includes an LNA driving a low level of impedance in a low voltage gain path, thus achieving high linearity in the presence of large blockers, and driving a high level of impedance in a high voltage gain path to increase the LNA's voltage gain and minimize performance degradation due to a noisier, low power receiver front-end chain following the LNA. The present disclosure is further directed to a local oscillator (LO) offset circuit with low power and reduced spur generation.

20 Claims, 7 Drawing Sheets

(51) Int. Cl.
  *H04B 1/40*   (2015.01)
  *H04L 27/00*  (2006.01)
  *H04B 1/04*   (2006.01)
  *H03F 1/22*   (2006.01)
  *H03F 3/26*   (2006.01)
  *H03K 21/08*  (2006.01)

(56) References Cited

U.S. PATENT DOCUMENTS

| | | | | |
|---|---|---|---|---|
| 7,082,292 B2* | 7/2006 | Underbrink | ............ | G01S 19/235 |
| | | | | 455/13.2 |
| 7,424,271 B2* | 9/2008 | Shih | ................ | H01Q 1/242 |
| | | | | 455/127.4 |
| 7,773,962 B2* | 8/2010 | Sutskover | ............. | H03L 7/1974 |
| | | | | 455/130 |
| 8,275,330 B1* | 9/2012 | Khlat | ................ | H04B 1/0475 |
| | | | | 375/296 |
| 8,525,605 B2* | 9/2013 | Yamakawa | ............ | H03B 19/00 |
| | | | | 331/116 M |
| 8,594,608 B2* | 11/2013 | Namba | ................ | H03B 21/02 |
| | | | | 331/175 |
| 9,793,857 B1* | 10/2017 | Anderson | ............ | H03D 7/1466 |
| 2004/0132421 A1* | 7/2004 | Underbrink | ............ | G01S 19/235 |
| | | | | 455/255 |
| 2005/0266805 A1* | 12/2005 | Jensen | ............... | H03M 7/3017 |
| | | | | 455/82 |
| 2012/0182077 A1* | 7/2012 | Yamakawa | ............ | H03B 19/00 |
| | | | | 331/34 |

* cited by examiner

LOW POWER SPECTRALLY PURE OFFSET LOCAL OSCILLATOR SYSTEM

CROSS REFERENCE TO RELATED APPLICATIONS

This application claims the benefit of U.S. Provisional Application No. 62/393,384, filed Sep. 12, 2016, which is incorporated herein by reference in its entirety.

TECHNICAL FIELD

This application relates generally to transceiver front-end, including low-noise amplifiers (LNAs) and local oscillators (LOs).

BACKGROUND

Each component in a receiver front-end contributes noise to the overall system. The noise of a component can be characterized by its noise factor (F), which is given by the ratio of the signal-to-noise ratio (SNR) at the input of the component to the SNR at the output of the component:

$$F = SNR_{IN}/SNR_{OUT}$$

The noise of the receiver front-end increases from input to output as noise from successive components compound. In general, the overall noise factor of the receiver front-end is proportional to the sum of each component's noise factor divided by the cascaded gain of preceding components and is given by:

$$F_{TOTAL} = F_1 + \frac{F_{2-1} - 1}{A_1} + \frac{F_{3-1} - 1}{A_1 A_2} + \ldots + \frac{F_{n-1} - 1}{A_1 A_2 \ldots A_{n-1}}$$

where $F_n$ and $A_n$ represent the noise factor and gain of the nth component in the receiver front-end, respectively. The above equation reveals that the noise factor and gain of the first gain component (i.e., $F_1$ and $A_1$, respectively) can have a dominant effect on the overall noise factor of the receiver front-end since the noise contributed by each successive component is diminished by the cascaded gain of the components that precede it.

To provide adequate sensitivity, therefore, it is important to keep the noise factor low and the gain high of the first gain component in the receiver front-end. The sensitivity of the receiver front-end determines the minimum signal level that can be detected and is limited by the overall noise factor of the receiver front-end. Thus, in typical receiver designs the first gain component in the front-end is a low-noise amplifier (LNA), which can provide high gain, while contributing low noise to the overall receiver front-end.

Wireless receiver front-ends commonly demand low power consumption to provide, for example, a longer battery life in battery powered devices. But low power makes components in the wireless receiver front-end noisier. In order to overcome the increased noise associated with low power components that follow an LNA, the LNA can raise its voltage gain. The voltage gain of the LNA can be increased without using more current (and thus without burning more power) by increasing the output impedance of the LNA.

However, such an increase in LNA voltage gain has its own associated drawbacks. In particular, LNAs provide relatively linear gain for small input signals, but for large input signals, LNAs can exhibit non-linear behavior in the form of gain compression and noise folding in band. In the presence of a large blocker the desired signal can experience less amplification due to gain compression and also low frequency noise from supply and bias blocks can mix with the high frequency blocker due to LNA non-linearities and fold in band, resulting in a degraded signal-to-noise ratio. Thus, by increasing an LNA's output impedance to increase the LNA's voltage gain, the LNA becomes more susceptible to non-linear behavior due to blockers.

BRIEF DESCRIPTION OF THE DRAWINGS/FIGURES

The accompanying drawings, which are incorporated herein and form a part of the specification, illustrate the present disclosure and, together with the description, further serve to explain the principles of the disclosure and to enable a person skilled in the pertinent art to make and use the disclosure.

The present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an example embodiment" etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be apparent to persons skilled in the relevant art(s) that various elements and features of the present disclosure, as described herein, can be implemented in hardware using analog and/or digital circuits, in software, through the execution of instructions by one or more general purpose or special-purpose processors, or as a combination of hardware and software.

1. OVERVIEW

As mentioned above, an LNA's output impedance can be increased to provide more voltage gain to compensate for increased noise by components downstream from the LNA in a receiver front-end operating in a low-power mode. However, as an LNA's output impedance increases to provide more voltage gain, the linearity of the LNA degrades due to the presence of large blockers in the environment in which the receiver front-end is operating. Several techniques have been proposed to alleviate this tradeoff between output impedance and linearity of LNAs.

One such technique involves adjusting the output impedance of an LNA in a receiver front-end in a programmable way between a low impedance and a high impedance by switchably coupling, either in parallel or series, units of impedance. The low impedance can be used when the receiver front-end is not operating in a low-power mode, and the high impedance can be used when the receiver front-end is operating in a low-power mode. The problem with this technique is that it is difficult to change the output impedance level of an LNA in a programmable way due to parasitic impedances from active and passive devices used in the programmable impedance circuitry. As a result of these parasitic impedances, it is hard to programmatically shut-down the low impedance components to achieve a high impedance value.

The present disclosure is directed to a dual output path LNA that can be used to break the tradeoff between the output impedance and linearity of an LNA without the problems of a programmable output impedance LNA. In an embodiment, the dual output path architecture includes an LNA driving a low level of impedance in a low voltage gain path, thus achieving high linearity in the presence of large blockers, and driving a high level of impedance in a high voltage gain path to increase the LNA's voltage gain and minimize performance degradation due to a noisier, low power receiver front-end chain following the LNA.

The present disclosure is further directed to a local oscillator (LO) offset circuit with low power and reduced spur generation.

2. SINGLE INPUT, DUAL OUTPUT PATH LNA

Figure 1:
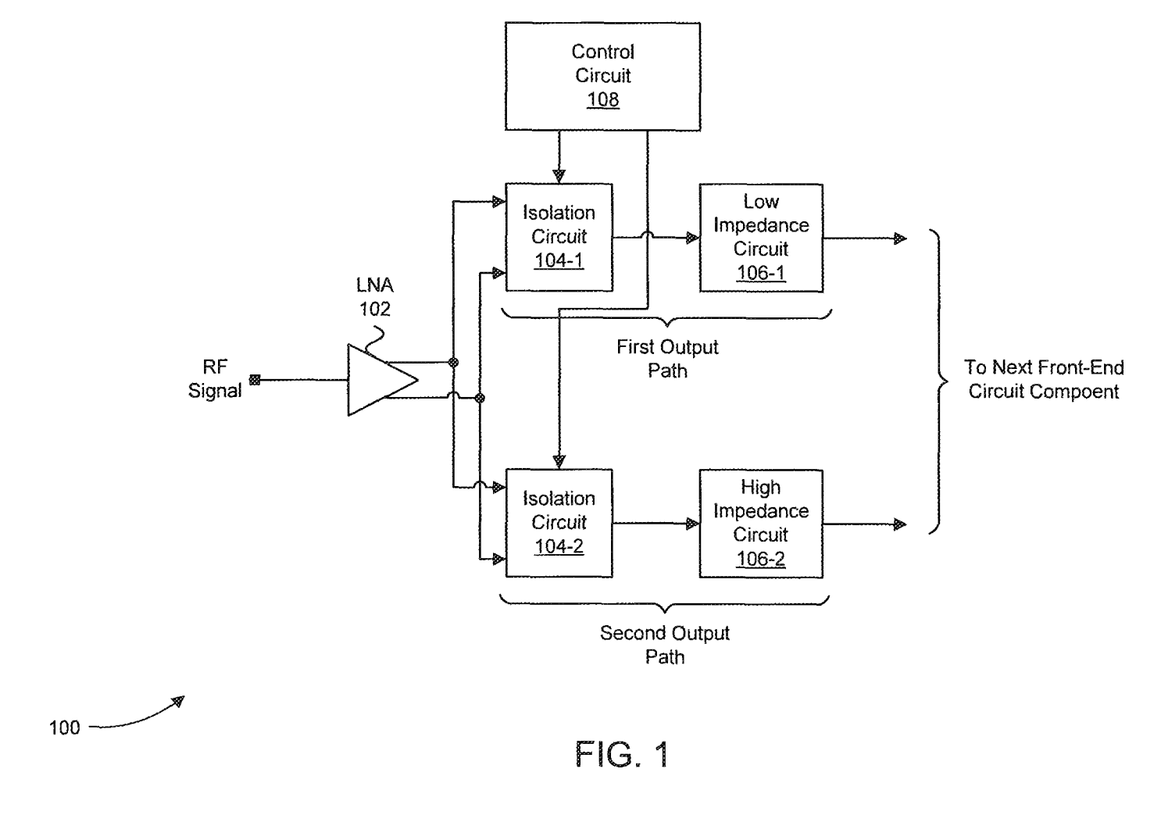
FIG. 1 illustrates an example front-end with a single input, dual output path LNA in accordance with embodiments of the present disclosure.

FIG. 1 illustrates an example front-end 100 with a single input, dual output path LNA in accordance with embodiments of the present disclosure. Example front-end 100 can be implemented, for example, in a wireless receiver, such as a personal area network receiver or a local area network receiver. Personal area networks include, for example, Bluetooth, Z-Wave, Zigbee, INSTEON, etc.

As shown in FIG. 1, example front-end 100 includes an LNA 102, two isolation circuits 104-1 and 104-2, two impedance circuits 106-1 and 106-2, and a control circuit 108. LNA 102 has a single input that receives a radio-frequency (RF) signal and provides an amplified version of the RF signal at its output. LNA 102 can have a differential output, as shown in FIG. 1, or a single-ended output in other front-end implementations. The output of LNA 102 is coupled to two output paths: a first output path comprising isolation circuit 104-1 and low impedance circuit 106-1, and a second output path comprising isolation circuit 104-2 and high impedance circuit 106-2.

Both of the first output path of LNA 102 and the second output path of LNA 102 are coupled to the next front-end circuit component (not shown) in example front-end 100. However, each output path only provides the amplified RF signal from the output of LNA 102 to the next front-end circuit component when "turned-on." In one embodiment, depending on a current power mode of example front-end 100, one of the two output paths of LNA 102 can be turned-on while the other is turned-off.

In particular, when front-end 100 is operating in a low-power mode (e.g., when a low-supply voltage is provided to the circuit components of front-end 100), the first output path of LNA 102 can be turned-off and the second output path of LNA 102 can be turned-on. This is because the second output path of LNA 102 has a high impedance circuit 106-2 (i.e., an impedance greater than the impedance of low impedance circuit 106-1), which provides more voltage gain to LNA 102 to compensate for increased noise by components downstream from LNA 102 operating in the low-power mode.

On the other hand, when front-end 100 is not operating in a low-power mode, the first output path of LNA 102 can be turned-on and the second output path of LNA 102 can be turned-off. This is because the first output path of LNA 102 has low impedance circuit 106-2 (i.e., an impedance less than the impedance of high impedance circuit 106-2), which improves the output linearity of LNA 102 in the presence of blockers.

The low power mode of operation can be enabled or disabled based on one or more factors. For example, the low power mode of operation can be enabled based on a current battery level of a battery used to power example front-end 100 and the device (e.g., laptop, smart phone, tablet, wearable device, etc.) in which example front-end 100 is implemented. In another example, the low power mode of operation can be enabled when blockers are not present in the operating environment of example front-end 100 or are not present to some predetermined extent in the operating environment of example front-end 100. In yet another example, the low power mode of operation can be enabled by a user of the device in which front-end 100 is implemented.

Isolation circuits 104-1 and 104-2 are configured to turn-on and -off the first and second output paths of LNA 102, respectively. More specifically, isolation circuit 104-1 can isolate the output of LNA 102 from low impedance circuit 106-1 when the first output path of LNA 102 is turned-off and not isolate the output of LNA 102 from low impedance circuit 106-1 when the first output path of LNA 102 is turned-on. Similarly, isolation circuit 104-2 can isolate the output of LNA 102 from high impedance circuit 106-2 when the second output path of LNA 102 is turned-off and not isolate the output of LNA 102 from high impedance circuit 106-2 when the second output path of LNA 102 is turned-on.

Control circuit 108 is configured to control isolation circuits 104-1 and 104-2 to turn-on and -off the first and second output paths, respectively, based on the current mode of operation of example front end 100 as explained above. Control circuit 108 can be implemented using special purpose circuitry and/or a processor programmed using instructions stored in memory.

Although not shown in FIG. 1, the next front-end circuit component or components can be, for example, a mixer, a filter, or an analog-digital converter to name few potential components.

Figure 2:
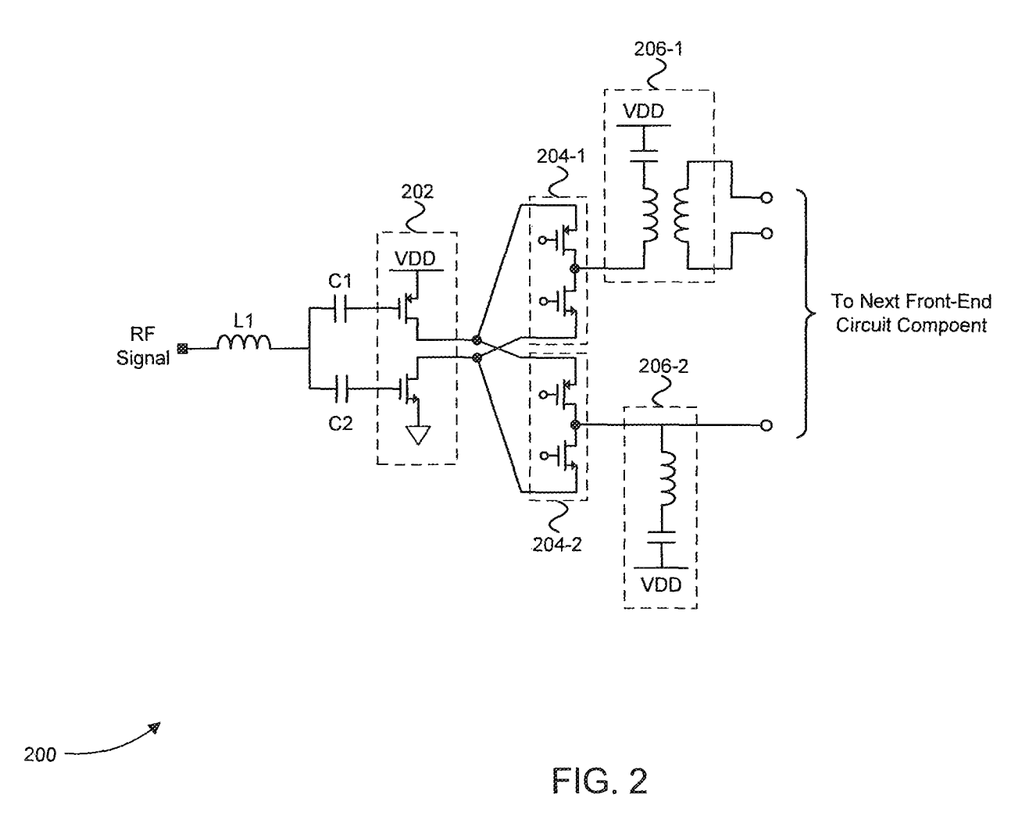
FIG. 2 illustrates another example front-end with a single input, dual output path LNA in accordance with embodiments of the present disclosure.

Referring now to FIG. 2, another example front-end 200 with a single input, dual output path LNA in accordance with embodiments of the present disclosure is illustrated. Example front-end 200 can be implemented, for example, in a wireless receiver, such as a personal area network receiver or a local area network receiver. Personal area networks include, for example, Bluetooth, Z-Wave, Zigbee, INSTEON, etc.

Example front-end 200 has the same basic configuration and functionality as example front-end 100 described above with respect to FIG. 1. In particular, example front-end 200 includes an LNA 202, two isolation circuits 204-1 and 204-2, two impedance circuits 206-1 and 206-2, and a control circuit (not shown for clarity purposes). LNA 202 is shown as a complementary metal oxide semiconductor (CMOS) LNA that has a single input that receives an RF signal and provides an amplified version of the RF signal at its output. LNA 202 can have a differential output, as shown in FIG. 2, or a single-ended output in other front-end implementations. The output of LNA 202 is coupled to two output paths: a first output path comprising isolation circuit 204-1 and low impedance circuit 206-1, and a second output path comprising isolation circuit 204-2 and high impedance circuit 206-2.

Both of the first output path of LNA 202 and the second output path of LNA 202 are coupled to the next front-end circuit component (not shown) in example front-end 200. However, each output path only provides the amplified RF signal from the output of LNA 202 to the next front-end circuit component when "turned-on." In one embodiment, depending on a current power mode of example front-end 200, one of the two output paths of LNA 202 can be turned-on while the other is turned-off.

In particular, when front-end 200 is operating in a low-power mode (e.g., when a low-supply voltage is provided to the circuit components of front-end 200), the first output path of LNA 202 can be turned-off and the second output path of LNA 202 can be turned-on. This is because the second output path of LNA 202 has a high impedance circuit 206-2 (i.e., an impedance greater than the impedance of low impedance circuit 206-1), which provides more voltage gain to LNA 202 to compensate for increased noise by components downstream from LNA 202 operating in the low-power mode. As shown in FIG. 2, the high impedance circuit 206-2 comprises an inductor-capacitor series combination coupled in parallel with the next front-end circuit component and to a supply voltage VDD, and the low impedance circuit 206-1 comprises a balun circuit with a capacitor on the single ended sided coupled to the supply voltage VDD. It should be noted that these two impedance circuits are exemplary and are not meant to be limiting.

On the other hand, when front-end 200 is not operating in a low-power mode, the first output path of LNA 202 can be turned-on and the second output path of LNA 202 can be turned-off. This is because the first output path of LNA 202 has low impedance circuit 206-1 (i.e., an impedance less than the impedance of high impedance circuit 206-2), which improves the output linearity of LNA 102 in the presence of blockers.

As explained above in regard to FIG. 1, the low power mode can be enabled or disabled based on one or more factors. For example, the low power mode of operation can be enabled based on a current battery level of a battery used to power example front-end 200 and the device (e.g., laptop, smart phone, tablet, wearable device, etc.) in which example front-end 200 is implemented. In another example, the low power mode of operation can be enabled when blockers are not present in the operating environment of example front-end 200 or are not present to some predetermined extent in the operating environment of example front-end 200. In yet another example, the low power mode of operation can be enabled by a user of the device in which front-end 200 is implemented.

Isolation circuits 204-1 and 204-2 are configured to turn-on and -off the first and second output paths of LNA 202, respectively. More specifically, isolation circuit 204-1 can isolate the output of LNA 202 from low impedance circuit 206-1 when the first output path of LNA 202 is turned-off and not isolate the output of LNA 202 from low impedance circuit 206-1 when the first output path of LNA 202 is turned-on. Similarly, isolation circuit 204-2 can isolate the output of LNA 202 from high impedance circuit 106-2 when the second output path of LNA 202 is turned-off and not isolate the output of LNA 202 from high impedance circuit 206-2 when the second output path of LNA 202 is turned-on. As shown in FIG. 2, isolation circuits 204-1 and 204-2 are each implemented using a cascode transistor configuration. The gates of the series coupled pair of metal oxide semiconductor transistors can be driven by the controller (not shown in FIG. 2) for each cascode to: turn-off the pair of transistors to provide the above described isolation, and turn-on the pair of transistors to disable the above described isolation.

Although not shown in FIG. 2, the next front-end circuit component or components can be, for example, a mixer, a filter, or an analog-digital converter to name few. Also, LNA 202 is shown in FIG. 2 as having an exemplary matching network of an inductor L1 and capacitors C1 and C2. However, other matching networks with different components and configurations can be used without departing from the scope and spirit of the present disclosure as would be appreciated by one of ordinary skill in the art.

Figure 3:
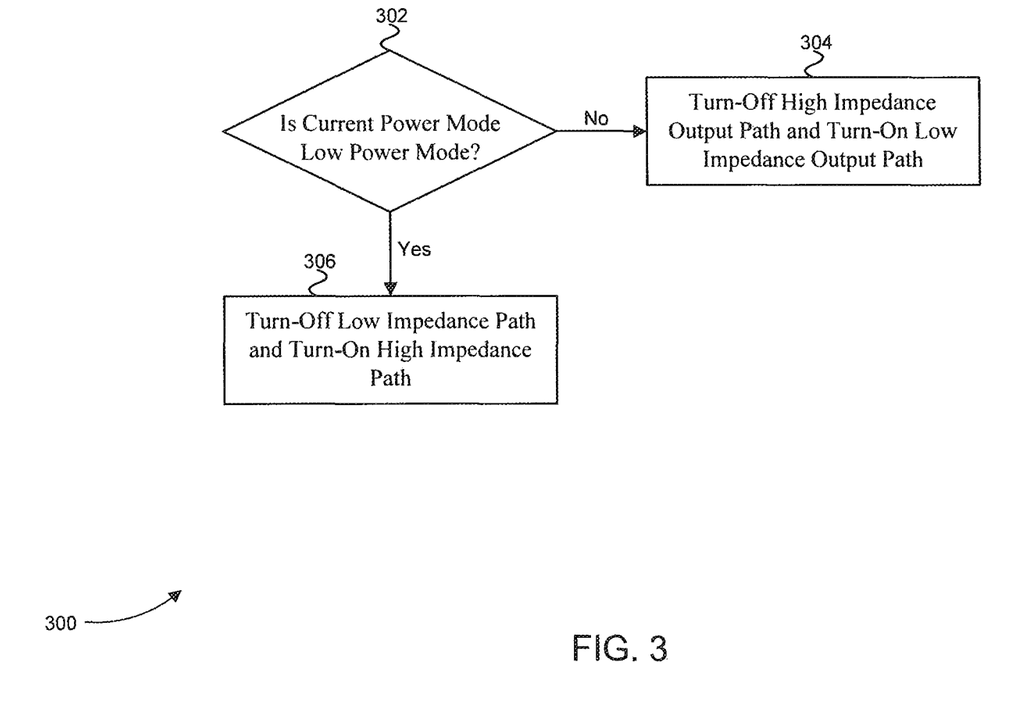
FIG. 3 illustrates an example flowchart of a method for controlling a single input, dual output path LNA in accordance with embodiments of the present disclosure.

FIG. 3 illustrates an example flowchart 300 of a method for controlling a single input, dual output path LNA, such as those described above in regard to FIGS. 1 and 2 above, in accordance with embodiments of the present disclosure. In one embodiment, the method of flowchart 300 can be implemented by a control circuit, such as control circuit 108 in FIG. 1.

As shown in FIG. 3, the method of flowchart 300 begins at step 302. At step 302, a determination is made as to whether the receiver front-end or device in which the single input, dual output path LNA is implemented is currently operating in a low power mode. The low power mode can be enabled or disabled based on one or more factors in the receiver front-end or device in which the single input, dual output path LNA is implemented. For example, the low power mode of operation can be enabled based on a current battery level of a battery used to power example the front-end or the device (e.g., laptop, smart phone, tablet, wearable device, etc.) in which the single input, dual output LNA is implemented. In another example, the low power mode of operation can be enabled when blockers are not present in the operating environment of the front-end or are not present to some predetermined extent in the operating environment of the front-end. In yet another example, the low power mode of operation can be enabled by a user of the device in which front-end is implemented.

If the front-end or device is not currently operating in a low power mode, the method of flowchart 300 proceeds to step 304. At step 304, the high impedance output path of the single input, dual output path LNA is turned-off, while the low impedance output path is turned-on. Example high impedance and low impedance output paths were described above in regard to FIGS. 1 and 2 above. For example, in FIG. 1, the low impedance output path corresponds to the first output path with isolation circuit 104-1 and low impedance circuit 106-1, while the high impedance output path corresponds to the second output path with isolation circuit 104-2 and high impedance circuit 106-2.

If, on the other hand, the front-end or device is currently operating in a low power mode, the method of flowchart 300 proceeds to step 306. At step 306, the high impedance output path of the single input, dual output path LNA is turned-on, while the low impedance output path is turned-off.

3. LOW POWER, SPECTRALLY PURE OFFSET LOCAL OSCILLATOR (LO) SYSTEM

In a radio transmitter, the back-end is generally defined as the portion of the transmitter that sits between the baseband system and the antenna. The back-end typically includes, among other components, one or more mixers for up-converting a baseband signal to a carrier frequency and a power amplifier for boosting the strength of the up-converted signal before it is transmitted by an antenna. In addition to the above mentioned components, the back-end includes a digital-to-analog converter (DAC) at some point before the antenna to convert the signal to be transmitted from a digital signal to an analog signal.

Figure 4:
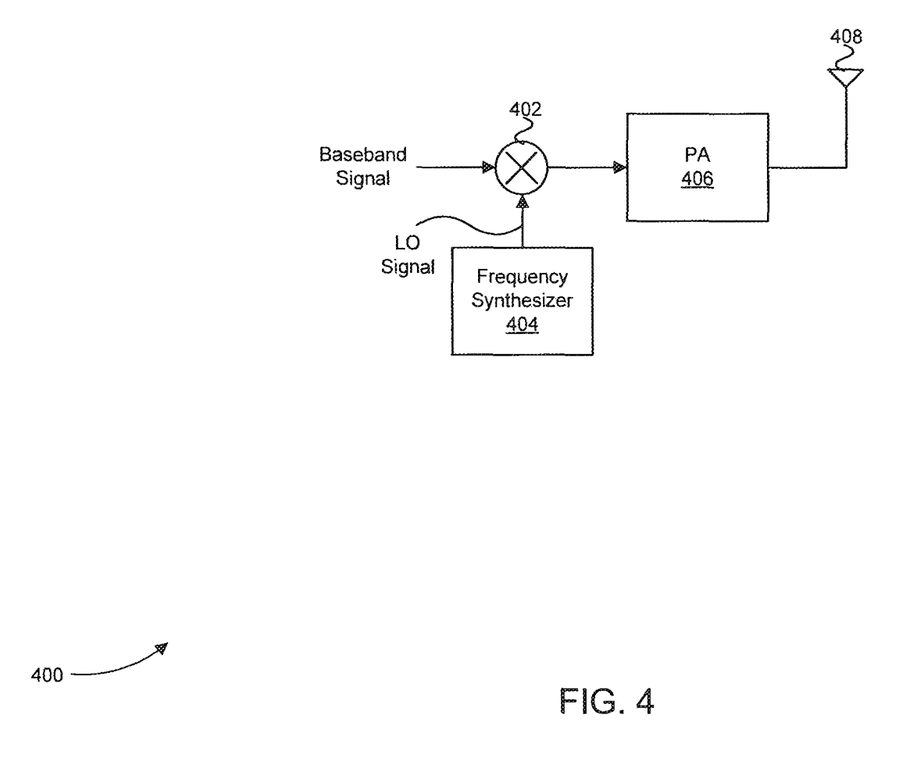
FIG. 4 illustrates an example back-end in accordance with embodiments of the present disclosure.

FIG. 4 illustrates an example back-end 400 in accordance with embodiments of the present disclosure. Example back-end 400 can be implemented, for example, in a wireless transmitter, such as a personal area network transmitter or a local area network transmitter. Personal area networks include, for example, Bluetooth, Z-Wave, Zigbee, INSTEON, etc.

In operation, example back-end 400 is configured to receive data (e.g., voice, video, and/or internet traffic) as a baseband signal and process the baseband signal so that it can be transmitted over a channel. More specifically, a mixer 402 mixes the baseband signal with a local oscillator (LO) signal produced by a frequency synthesizer 404 to up-convert the baseband signal to a carrier frequency. Frequency synthesizer 404 can include a crystal oscillator for generating an oscillating, signal that is then frequency adjusted by a phase-locked loop (PLL) to generate the LO signal at the desired frequency. The PLL typically uses a voltage controlled oscillator (VCO) to specifically generate the LO signal. After up-conversion, the up-converted signal is amplified by a power amplifier (PA) 406 before it is transmitted by an antenna 408. Although shown as a non-complex baseband signal in FIG. 4, in other embodiments the baseband signal can be complex.

The traditional problem in generating an LO signal for a back-end in a Bluetooth transmitter (and in other similar back-ends) is that if the input signal to the PA in the back-end is at a sub-multiple frequency of the VCO in the frequency synthesizer, the harmonics of the output signal of PA pull the VCO, impairing performance.

In order to solve this problem, an offset-LO scheme can be used such that the frequency of the output signal of the PA is not at a sub-multiple of the VCO frequency. More specifically, the frequency synthesizer (and more particularly its VCO) is configured to provide the LO signal at a frequency that is offset from the desired LO signal so that the frequency of the output signal of the PA is not at a sub-multiple of the VCO frequency. Then, an LO offset circuit is used to adjust the frequency of the LO signal to the desired frequency before the LO signal is mixed with the baseband signal.

Figure 5:
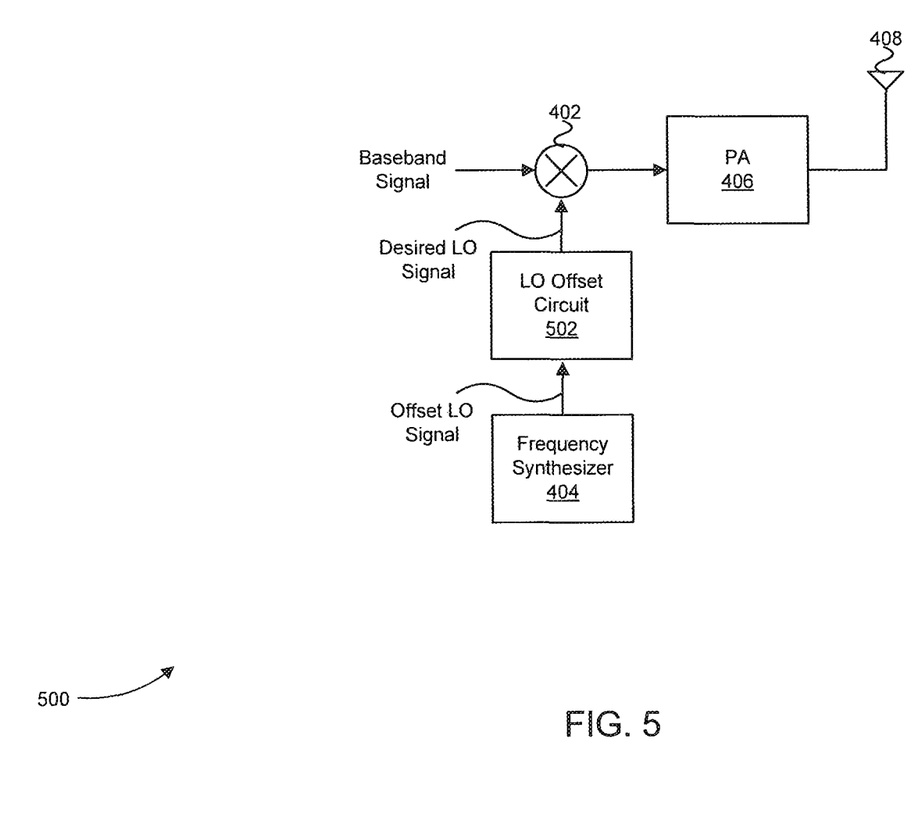
FIG. 5 illustrates an example back-end with an LO offset circuit in accordance with embodiments of the present disclosure.

This LO offset scheme is used in FIG. 5, where another example back-end 500 is shown in accordance with embodiments of the present disclosure. Example back-end 500 has the same general configuration and functionality as described above in regard to FIG. 4, except that frequency synthesizer 404 now generates an LO signal with an offset from the desired LO frequency and a LO offset circuit 502 is used to correct the offset to provide the LO signal at the desired frequency to mixer 402.

Although LO offset circuit 502 can help to reduce the harmonics of the output signal of PA 406 from pulling the VCO implemented by the PLL of frequency synthesizer 404, LO offset circuit 502 can present its own problems. In particular, implementing LO offset circuit 502 in a manner that provides good power performance and does not generate unwanted spurs that are radiated by antenna 408 can be difficult.

Figure 6:
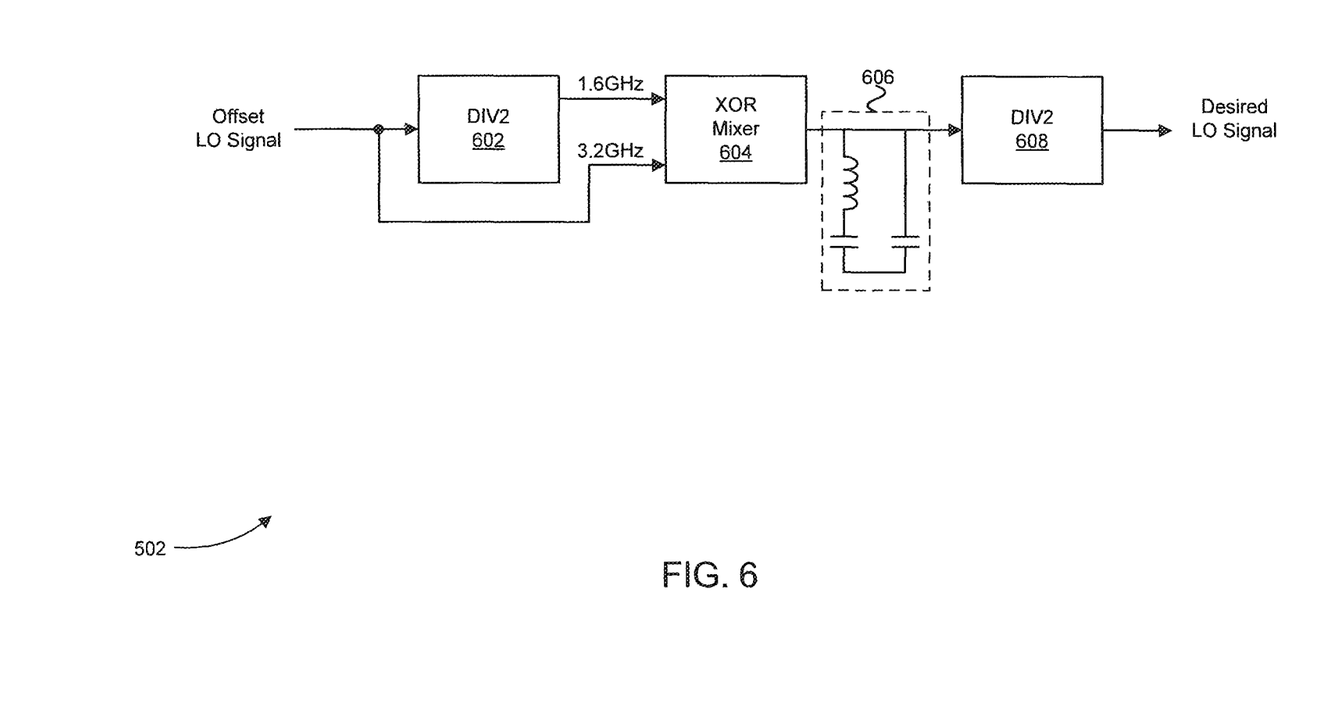
FIG. 6 illustrates an example LO offset circuit in accordance with embodiments of the present disclosure.

FIG. 6 illustrates one exemplary implementation of LO offset circuit 502 that has good power performance and reduced spur generation in accordance with embodiments of the present disclosure. The implementation of LO offset circuit 502 in FIG. 6 assumes a desired LO frequency of 2.4 GHz, which is commonly used by Bluetooth transmitters, and an offset LO signal with a frequency that is 4/3 of the desired LO frequency, or 3.2 GHz. It should be noted that other desired and offset frequencies can be used by adjusting the configuration of LO offset circuit in a manner that would be readily understood by persons of ordinary skill in the art.

As shown in FIG. 6 LO offset circuit 502 includes a divide by 2 circuit (DIV2) 602, an exclusive OR (XOR) mixer 604, a bi-resonant inductor-capacitor (LC) filter 606, and a DIV2 608. DIV2 602 first processes the offset LO signal at 3.2 GHz to generate a 1.6 GHz oscillator signal. XOR mixer 604 then mixes the 1.6 GHz oscillator signal and the offset LO signal at 3.2 GHz, which produces a frequency shifted offset LO signal at the output of XOR mixer 604 having a desired harmonic at 4.8 GHz and an undesired harmonic at 1.6 GHz.

To prevent the undesired harmonic at 1.6 GHz from appearing in the final output of LO offset circuit 502, bi-resonant LC filter 606 is configured with appropriate values for its capacitors and inductor to pass the wanted harmonic at 4.8 GHz to DIV2 608, while filtering out (or "notching away") the unwanted harmonic at 1.6 GHz that can lead to spurs. The final DIV2 608 divides down the filter signal with the 4.8 GHz harmonic to provide the desired LO signal with a harmonic at 2.4 GHz.

It should be noted that, while XOR mixer 604 can provide a higher current efficiency over a conventional Gilbert cell mixer, either type of mixer (or even other types) can be used in LO offset circuit 502 without departing, from the scope and spirit of the present disclosure.

Figure 7:
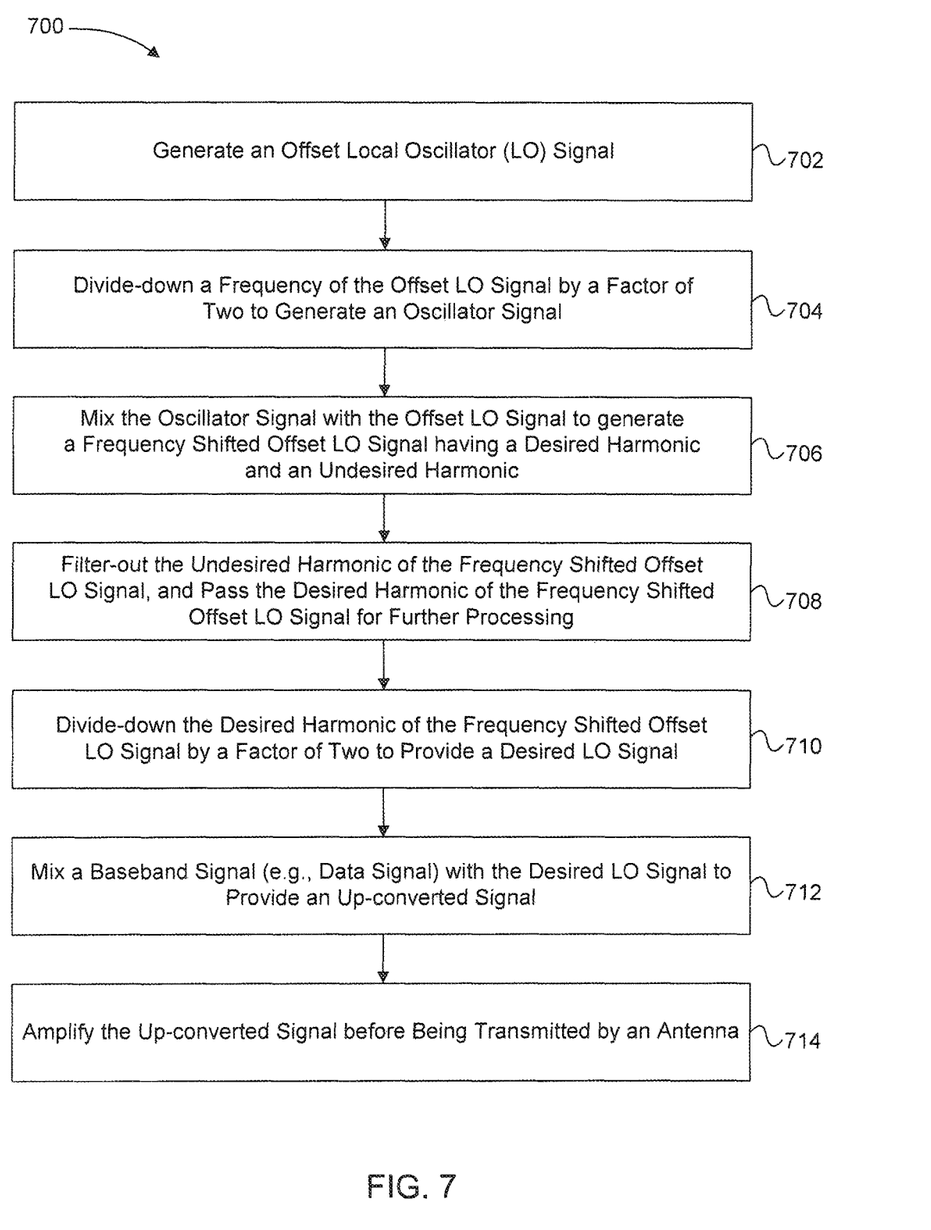
FIG. 7 illustrates an example flowchart of a method for operating a transmitter back-end in accordance with embodiments of the present disclosure.

FIG. 7 illustrates an example flowchart 700 of a method for operating a transmitter back-end, such as transmitter back-end 500 described above in regard to FIGS. 5-6 above, in accordance with embodiments of the present disclosure.

In step 702, an offset local oscillator (LO) signal is generated. For example, referring to FIG. 5, an offset local oscillator (LO) signal can be generated by the frequency synthesizer 404.

In step 704, a frequency of the offset LO signal is divided down by a factor of two to generate an oscillator signal. For example, the referring to FIG. 6, the DIV2 circuit 602 can divide the offset LO signal having a frequency of 3.2 GHz down by a factor of two to generate an oscillator signal having a frequency of 1.6 GHz.

In step 706, the oscillator signal is mixed with the offset LO signal to generate a frequency shifted offset LO signal having a desired harmonic and an undesired harmonic. For example, referring to FIG. 6, XOR mixer 603 can mix the oscillator signal having a frequency 1.6 GHz with the offset LO signal having a frequency of 3.2 GHz to generate a frequency shifted offset LO signal having a desired harmonic at 4.8 GHz and an undesired harmonic at 1.6 GHz.

In step 708, the undesired harmonic of the frequency shifted offset LO signal is filtered out and the desired harmonic of the frequency shifted offset LO signal is passed, for further processing. For example, referring to FIG. 6, the bi-resonant filter 606 can be configured to "notch-out" the undesired harmonic at 1.6 GHz, and pass the desired harmonic at 4.8 GHz for further processing.

In step 710, the desired harmonic of the frequency shifted offset LO signal is divided down by a factor of 2 to provide the desired LO signal. For example, referring to FIG. 6, the DIV2 circuit 608 can divide down the desired harmonic at 4.8 GHz of the frequency shifted offset LO signal by a factor or 2 to provide a desired LO signal having a frequency of 2.4 GHz.

It is noted that the steps 704-710 can be described/summarized as adjusting a frequency of the offset LO signal to provide the desired LO signal, wherein a frequency of the desired LO signal is, for example, ¾ the frequency of the offset LO signal.

Referring back to flowchart 700, in step 712 a baseband signal (e.g., data signal) is mixed with the desired LO signal to provide an up-converted signal. For example, the mixer 402 can mix a baseband signal with the desired LO signal provide an up-converted signal having a carrier frequency, (e.g. 2.4 GHz).

In step, 714, the up-converted signal is amplified by, for example, a power amplifier 406 before being transmitted by an antenna 408.

4. CONCLUSION

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

What is claimed is:

1. A transmitter back-end comprising:
   a frequency synthesizer configured to generate an offset local oscillator (LO) signal;
   an LO offset circuit configured to adjust a frequency of the offset LO signal to provide a desired LO signal;
   a back-end mixer configured to mix a baseband signal and the desired LO signal to provide an up-converted signal; and
   a power amplifier (PA) configured to amplify the up-converted signal output by the back-end mixer;
   wherein the LO offset circuit comprises:
   an offset mixer configured to frequency shift the offset LO signal to provide a frequency shifted offset LO signal; and
   a filter configured to filter an unwanted portion of the frequency shifted offset LO signal.

2. The transmitter back-end of claim 1, wherein the LO offset circuit further comprises:
   a first divide by 2 circuit configured to divide down a frequency of the offset LO signal by a factor of two before the offset LO signal is processed by the offset mixer.

3. The transmitter back-end of claim 2, wherein the LO offset circuit further comprises:
   a second divide by 2 circuit configured to divide down a frequency of the frequency shifted offset LO signal by a factor of two to provide the desired LO signal.

4. The transmitter back-end of claim 1, wherein the offset LO signal has a frequency of 3.2 GHz.

5. The transmitter back-end of claim 4, wherein the desired LO signal has a frequency of 2.4 GHz.

6. The transmitter back-end of claim 1, wherein the unwanted portion of the frequency shifted offset LO signal has a frequency of 1.6 GHz, and a wanted portion of the frequency shifted offset LO signal has a frequency of 4.8 GHz.

7. The transmitter back-end circuit of claim 6, wherein the filter notches out the frequency of 1.6 GHz in the frequency shifted offset LO signal and passes the frequency of 4.8 GHz in the frequency shifted offset LO signal.

8. The transmitter back-end circuit of claim 7, further comprising a second divide by 2 circuit configured to divide down the 4.8 GHz frequency in the frequency shifted offset LO signal by a factor of two to provide the desired LO signal having a frequency of 2.4 GHz.

9. The transmitter back-end circuit of claim 1, wherein the frequency of the offset LO signal is greater than a frequency of the desired LO signal.

10. The transmitter back-end of claim 1, wherein the frequency of the offset LO signal is 4/3 of the frequency of the desired LO signal.

11. The transmitter back-end of claim 1, wherein the filter is a bi-resonant LC filter having at least one capacitor and at least one inductor configured to notch out the unwanted portion and pass a wanted portion of the frequency shifted offset LO signal.

12. The transmitter back-end of claim 1, wherein the desired LO signal is not a sub-multiple of the offset LO signal.

13. A transmitter back-end comprising:
   a frequency synthesizer configured to generate an offset local oscillator (LO) signal;
   an LO offset circuit configured to adjust a frequency of the offset LO signal to provide a desired LO signal;
   a back-end mixer configured to mix a baseband signal and the desired LO signal to provide an up-converted signal; and a power amplifier (PA) configured to amplify the up-converted signal output by the back-end mixer, wherein the frequency of the offset LO signal is 4/3 of the frequency of the desired LO signal.

14. A transmitter back-end comprising:
a local oscillator (LO) offset circuit configured to receive an offset LO signal and adjust a frequency of the offset LO signal to provide a desired LO signal, wherein a frequency of the offset LO signal is 4/3 that of a frequency of the desired LO signal;
a back-end mixer configured to mix a baseband signal and the desired LO signal to provide an up-converted signal; and
a power amplifier (PA) configured to amplify the up-converted signal output by the back-end mixer;
wherein the LO offset circuit comprises:
a first divide by 2 circuit configured to divide down a frequency of the offset LO signal by a factor of two to generate an oscillator signal;
an offset mixer configured to mix the oscillator signal with the offset LO signal to provide a frequency shifted offset LO signal having a desired harmonic and an undesired harmonic; and
a filter configured to filter out the undesired harmonic of the frequency shifted offset LO signal.

15. The transmitter back-end of claim 14, further comprising:
a second divide by 2 circuit configured to divide down the desired harmonic of the frequency shifted offset LO signal by a factor of 2 to provide the desired LO signal.

16. The transmitter back-end of claim 15, wherein the filter is a bi-resonant LC filter having at least one capacitor and at least one inductor configured to notch out the undesired harmonic of the frequency shifted offset LO signal and pass the desired harmonic of the frequency shifted offset LO signal.

17. The transmitter back-end of claim 15, wherein a frequency of the offset LO signal is 3.2 GHz, and a frequency of the desired LO signal is 2.4 GHz.

18. The transmitter back-end of claim 17, wherein a frequency of the desired harmonic of the frequency shifted offset LO signal is 4.8 GHz, and a frequency of the undesired harmonic of the frequency shifted offset LO signal is 1.6 GHz.

19. A method of operating a back-end transmitter, comprising:
generating an offset local oscillator (LO) signal;
adjusting a frequency of the offset LO signal to provide a desired LO signal, wherein a frequency of the desired LO signal is 3/4 the frequency of the offset LO signal;
mixing a baseband signal and the desired LO signal to provide an up-converted signal; and
amplifying the up-converted signal;
wherein adjusting the frequency of the offset LO signal comprises:
dividing down the frequency of the offset LO signal by a factor of two to generate an oscillator signal;
mixing the oscillator signal with the offset LO signal to provide a frequency shifted offset LO signal having a desired harmonic and an undesired harmonic;
filtering out the undesired harmonic of the frequency shifted offset LO signal and passing the desired harmonic of the frequency shifted offset LO signal; and
dividing down the desired harmonic of the frequency shifted offset LO signal by a factor of 2 to provide the desired LO signal.

20. The method of claim 19, wherein:
the frequency of the offset LO signal is 3.2 GHz;
the frequency of the desired LO signal is 2.4 GHz;
a frequency of the desired harmonic of the frequency shifted offset LO signal is 4.8 GHz; and
a frequency of the undesired harmonic of the frequency shifted offset LO signal is 1.6 GHz.

* * * * *